US009755587B1

(12) United States Patent
Arell

(10) Patent No.: US 9,755,587 B1
(45) Date of Patent: Sep. 5, 2017

(54) INTEGRATED RF LIMITER

(71) Applicant: Skyworks Solutions, Inc., Woburn, MA (US)

(72) Inventor: Thomas William Arell, Basking Ridge, NJ (US)

(73) Assignee: Skyworks Solutions, Inc., Woburn, MA (US)

(*) Notice: Subject to any disclaimer, the term of this patent is extended or adjusted under 35 U.S.C. 154(b) by 0 days.

(21) Appl. No.: 14/957,101

(22) Filed: Dec. 2, 2015

Related U.S. Application Data

(60) Provisional application No. 62/087,154, filed on Dec. 3, 2014.

(51) Int. Cl.
*H03G 3/30* (2006.01)
*H03F 1/52* (2006.01)
*H03F 3/193* (2006.01)

(52) U.S. Cl.
CPC ............ *H03F 1/523* (2013.01); *H03F 3/193* (2013.01); *H03F 2200/426* (2013.01); *H03F 2200/451* (2013.01)

(58) Field of Classification Search
CPC ... H03F 3/68; H03G 3/20; H03G 3/30; H03G 3/3036; H03G 3/3042
USPC ............... 330/124 R, 144, 145, 284, 295
See application file for complete search history.

(56) References Cited

U.S. PATENT DOCUMENTS

| | | | | |
|---|---|---|---|---|
| 5,301,081 A * | 4/1994 | Podell | ...... | H01Q 1/50 361/111 |
| 7,567,122 B2 * | 7/2009 | Sowlati | ...... | H03F 3/45098 330/144 |
| 8,624,670 B2 * | 1/2014 | Woo | ...... | H03F 1/3247 330/129 |
| 2008/0290951 A1 * | 11/2008 | Inoue | ...... | H03F 1/523 330/298 |
| 2015/0349720 A1 * | 12/2015 | Staudinger | ...... | H03F 1/0288 330/284 |

* cited by examiner

Primary Examiner — Steven J Mottola
(74) Attorney, Agent, or Firm — Knobbe, Martens, Olson & Bear, LLP

(57) ABSTRACT

A limiter circuit is integrated into an RF power amplifier. The limiter circuit automatically starts adding attenuation at the input of the RF power amplifier after a predetermined input power level threshold is exceeded, thereby extending the safe input drive level to protect the amplifier. In a preferred embodiment of the invention, the limiter circuit is implemented using a pseudomorphic high electron mobility transistor (PHEMT) device or a metal semiconductor field effect transistor (MESPET) device. Diode connected transistors or Schottky diodes may also be used in the limiter circuit.

20 Claims, 4 Drawing Sheets

INTEGRATED RF LIMITER

CROSS REFERENCE TO RELATED APPLICATION

This application claims benefit of provisional application Ser. No. 62/087,154, filed Dec. 3, 2014, which application is incorporated by reference herein in its entirety.

BACKGROUND

Radio frequency (RF) power amplifiers are sometimes subjected to input RF overdrive conditions, typically during a calibration procedure for cell phone applications. This overdrive condition can be destructive depending on other factors such as supply voltage and output load voltage standing wave ratio (VSWR).

SUMMARY

A limiter circuit is integrated into an RF power amplifier. The limiter circuit automatically starts adding attenuation at the input of the RF power amplifier after a predetermined input power level threshold is exceeded, thereby extending the safe input drive level to protect the amplifier. In a preferred embodiment of the invention, the limiter circuit is implemented using a pseudomorphic high electron mobility transistor (PHEMT) device or a metal semiconductor field effect transistor (MESFET) device. Diode connected transistors or Schottky diodes may also be used in the limiter circuit.

BRIEF DESCRIPTION OF DRAWING

These and other objects, features and advantages of the invention will be more readily apparent from the following detailed description in which.

DETAILED DESCRIPTION

Figure 1:
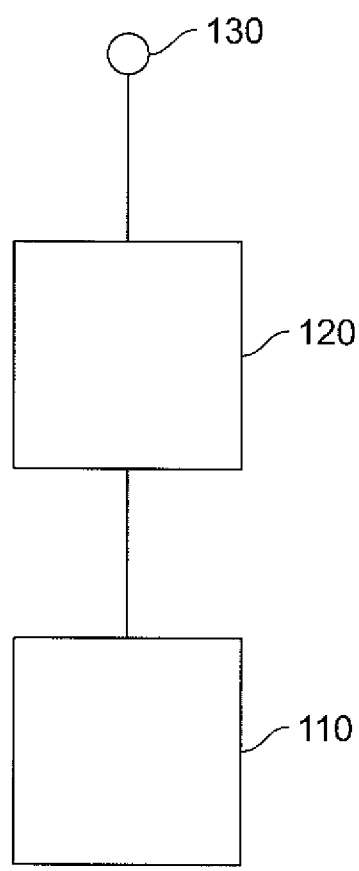
FIG. 1 is a block diagram of a first illustrative embodiment of the present invention.

FIG. 1 is a block diagram of an illustrative embodiment of the input section of a power amplifier of the invention such as might be used in a cellular phone. The input section comprises a power amplifier stage 110 and a limiter circuit 120. Illustratively, the power amplifier stage comprises a heterojunction bipolar transistopr (HBT) having an emitter, a base and a collector. The limiter circuit 120 comprises at least a first PHEMT or MESFET coupled between an RF signal input 130 and the base of the HBT. In addition, the limiter circuit may include one or more additional diode-connected PHEMTs or MESFETs coupled between the first PHEMT or MESFET and the collector of the HBT.

Figure 2:
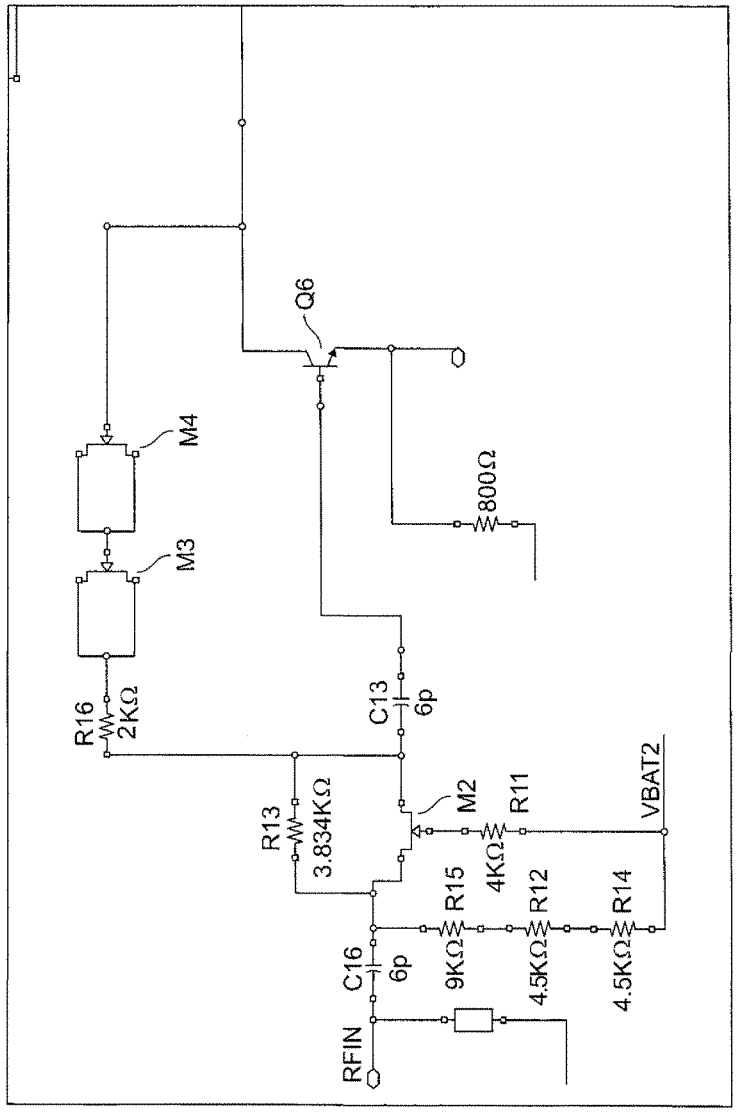
FIG. 2 is a schematic diagram of the first illustrative embodiment of the present invention.
Figure 3:
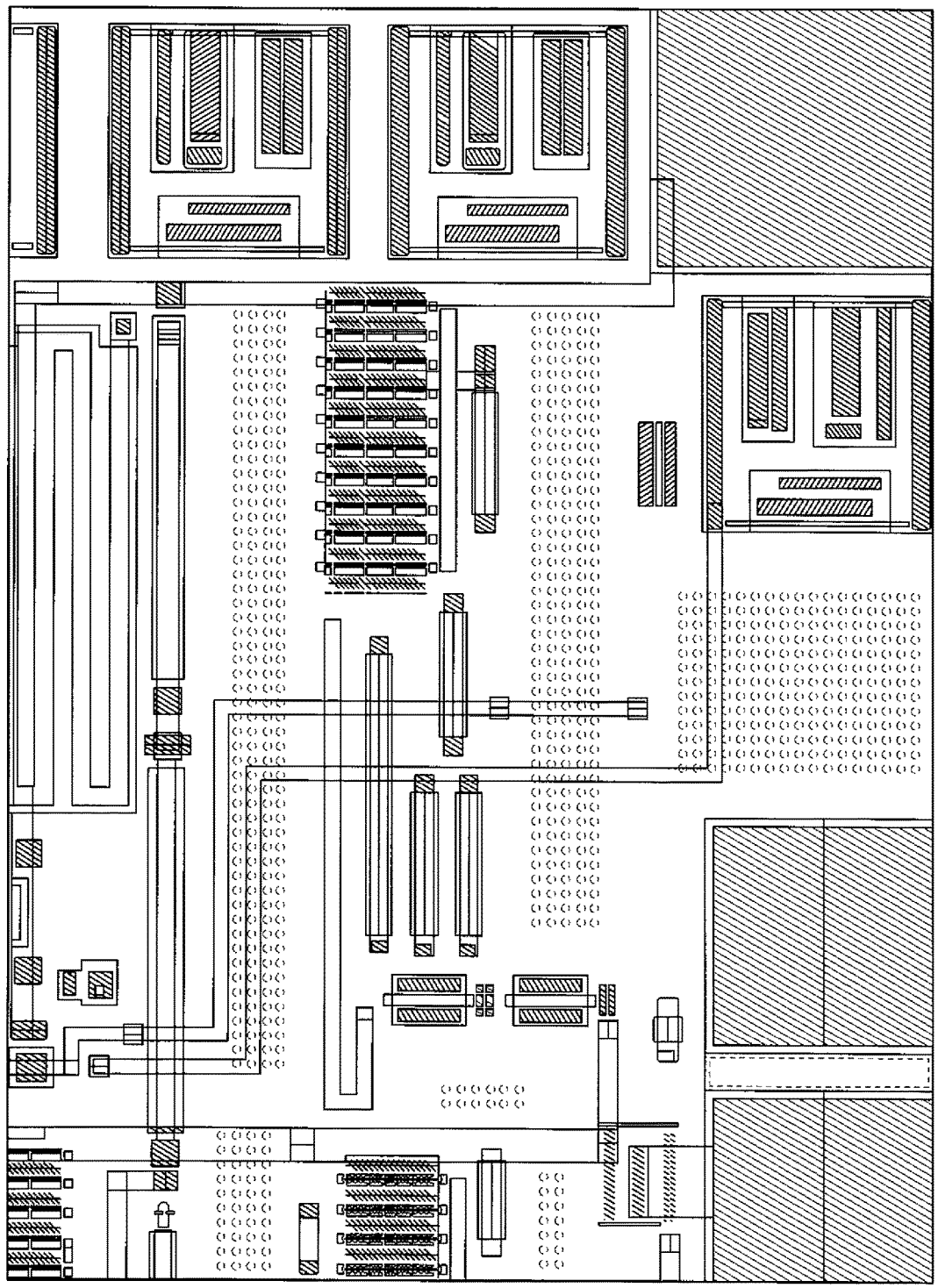
FIG. 3 is a layout of the first illustrative embodiment of the present invention.

FIG. 2 is a schematic depicting an illustrative embodiment of the input section of a cellular power amplifier with the integrated RF limiter of FIG. 1. The power amplifier stage comprises HBT Q6 having an emitter, a base and a collector. The limiter circuitry comprises: first PHEMT M2, second and third PHEMTs M3 and M4 connected as diodes, DC blocking capacitors C16 and C13, gate resistor R11, drain to source resistor R13, drain to supply resistor (sum of R15, R12, R14), and resistor R16 in series with detector diodes PHEMT M3 and M4. PHEMT M4 is connected to the collector of HBT RF stage Q6.

With RF applied to "RFIN" in the normal operational input power range, M2 is biased to be in a fully on low loss state. When the input level reaches a certain power level determined by the combination of the diodes, resistors and the RF gain of the first stage (Q6), the source and drain voltage of M2 will increase to become more positive relative to the gate causing M2 to start pinching off or go into a high loss state.

Figure 4:
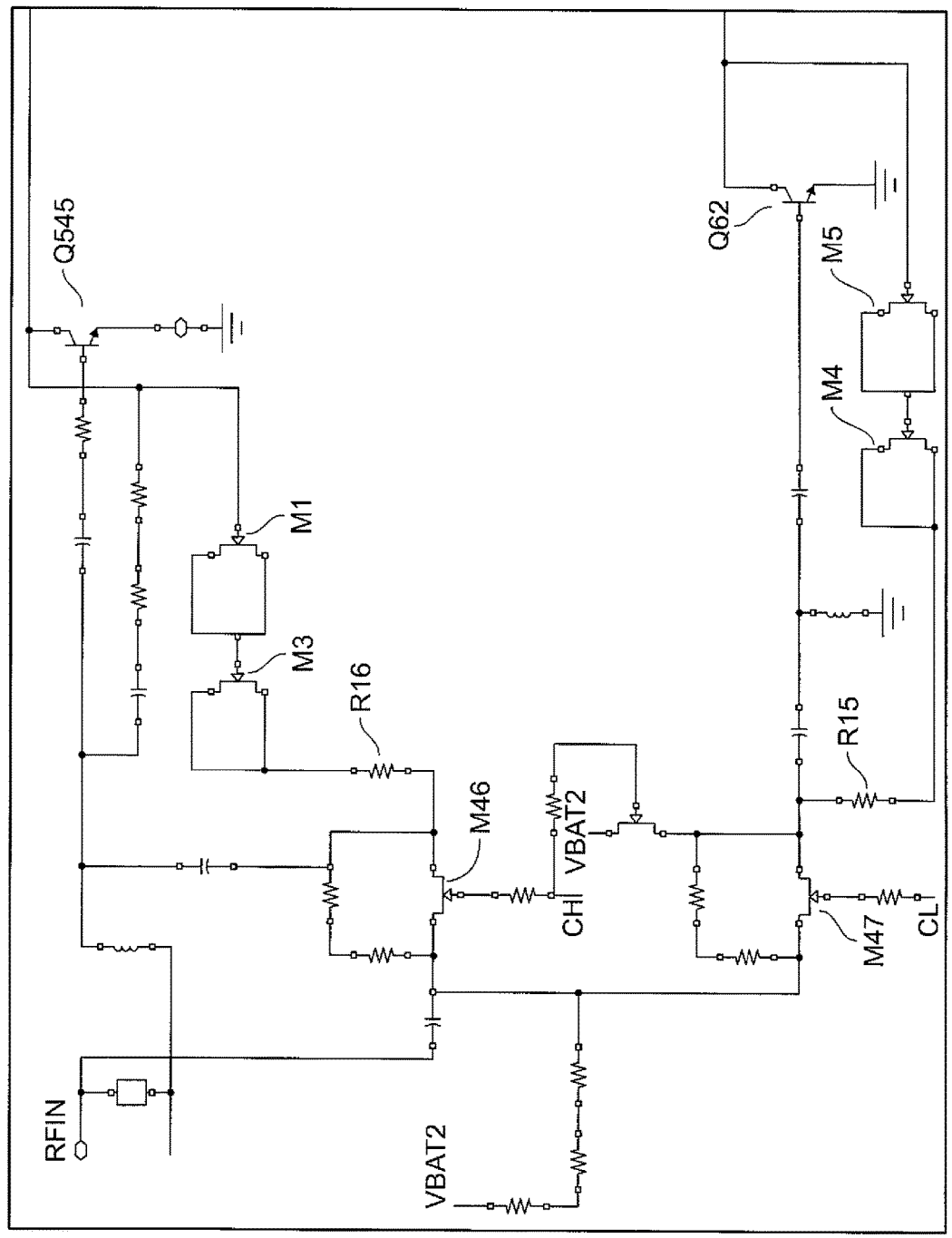
FIG. 4 is a schematic diagram of a second illustrative embodiment of the present invention

FIG. 4 is a schematic drawing depicting an alternate implementation where the power amplifier architecture has two paths, high power and low power, using a SP2T switch. The high power path includes a power amplifier stage comprising HBT Q545, and a limiter circuit comprising diodes M1 and M3 and PHEMT M46. The low power path includes a power amplifier stage comprising HBT Q62; and a limiter circuit comprising detector diodes M4 and M5 and PHEMT M47. Detector diodes M1 and M3 and resistor R16 are used to raise the drain source voltage of PHEMT switch M46 for high power path and detector diodes M4 and M5 and resistor R15 similarly raise the drain source voltage for PHEMT M47 for the low power path.

As shown in FIG. 4, the diodes are implemented using diode coupled PHEMT. Alternatively, MESFETs could be used in place of the PHEMTs or Schottky barrier diodes could be used in place of the PHEMTs or MESFETs.

Illustratively, the HBT and field effect transistor (FET) devices are formed in a III-V semiconductor material such as Gallium Nitride, Indium Phosphide, or Gallium Arsenide/Indium Gallium Phosphide. In some applications, it may be advantageous to integrate the HBT and the FET device in a single semiconductor crystal by epitaxially growing the HBT device on an epitaxially grown FET device. Such a device and the process for making it in a GaAs/InGaP epitaxial growth process is described in U.S. Pat. No. 7,015,519, which is incorporated herein by reference. Other materials may also be used.

As will be apparent to those skilled in the art, numerous variations may be practiced within the spirit and scope of the present invention.

What is claimed is:

1. A power amplifier comprising:
    a radio frequency power amplifier stage; and
    a limiter circuit coupled to an input of the radio frequency power amplifier stage, the limiter circuit automatically adding attenuation at the input after an input power level threshold is exceeded, the limiter circuit including at least a first pseudomorphic high electronic mobility transistor and at least a first diode coupled between the first pseudomorphic high electronic mobility transistor and an output of the radio frequency power amplifier stage.

2. The power amplifier of claim 1 wherein the radio frequency power amplifier stage includes at least one heterojunction bipolar transistor.

3. The power amplifier of claim 1 wherein the limiter circuit includes at least one metal semiconductor field effect transistor.

4. The power amplifier of claim 1 wherein the first diode is a Schottky barrier diode.

5. The power amplifier of claim 1 wherein the first diode is a diode-coupled pseudomorphic high electronic mobility transistor or a diode coupled metal semiconductor field effect transistor.

6. A power amplifier comprising:
a radio frequency power amplifier stage; and
a limiter circuit coupled to an input of the radio frequency power amplifier stage, the limiter circuit automatically adding attenuation at the input after an input power level threshold is exceeded, the radio frequency power amplifier stage including at least one heterojunction bipolar transistor, the limiter circuit including at least one field effect transistor, and the at least one heterojunction bipolar transistor and the at least one field effect transistor integrated on a single die.

7. The power amplifier of claim 6 wherein the single die is formed by an epitaxial growth process.

8. A power amplifier comprising:
a first radio frequency power amplifier stage in a high power path;
a first limiter circuit coupled to an input of the first radio frequency power amplifier stage, the limiter circuit automatically adding attenuation at the input after a first input power level threshold is exceeded, the first limiter circuit including at least a first pseudomorphic high electronic mobility transistor and at least a first diode coupled between the first pseudomorphic high electronic mobility transistor and an output of the power amplifier stage;
a second radio frequency power amplifier stage in a low power path; and
a second limiter circuit coupled to an input of the second radio frequency power amplifier stage, the limiter circuit automatically adding attenuation at the input after a second input power level threshold is exceeded.

9. The power amplifier of claim 8 wherein the first and second radio frequency power amplifier stages include at least one heterojunction bipolar transistor.

10. The power amplifier of claim 8 wherein the first and second limiter circuits include at least one pseudomorphic high electronic mobility transistor.

11. The power amplifier of claim 8 wherein the first and second limiter circuits include at least one metal semiconductor field effect transistor.

12. The power amplifier of claim 8 wherein the first diode is a Schottky barrier diode.

13. The power amplifier of claim 8 wherein the first diode is a diode-coupled pseudomorphic high electronic mobility transistor or a diode coupled metal semiconductor field effect transistor MESFET.

14. A power amplifier comprising:
a first radio frequency power amplifier stage in a high power path;
a first limiter circuit coupled to an input of the first radio frequency power amplifier stage, the limiter circuit automatically adding attenuation at the input after a first input power level threshold is exceeded;
a second radio frequency power amplifier stage in a low power path; and
a second limiter circuit coupled to an input of the second radio frequency power amplifier stage, the limiter circuit automatically adding attenuation at the input after a second input power level threshold is exceeded, at least one of the first radio frequency power amplifier stage or the second radio frequency power amplifier stage including at least one heterojunction bipolar transistor, at least one limiter circuit including at least one field effect transistor, and the at least one heterojunction bipolar transistor and the at least one field effect transistor integrated on a single die.

15. The power amplifier of claim 14 wherein the single die is formed by an epitaxial growth process.

16. A power amplifier comprising:
a first radio frequency power amplifier stage including a heterojunction bipolar transistor having an emitter, a base, and a collector; and
a first limiter circuit coupled to an input of the first power amplifier stage, the limiter circuit automatically adding attenuation at the input after an input power level threshold is exceeded, the first limiter circuit including at least one pseudomorphic high electronic mobility transistor having a source, a gate, and a drain, and at least one diode coupled between the source of the at least one pseudomorphic high electronic mobility transistor and the collector of the heterojunction bipolar transistor.

17. The power amplifier of claim 16 wherein the at least one diode is a Schottky barrier diode.

18. The power amplifier of claim 16 wherein the at least one diode is a diode-coupled pseudomorphic high electronic mobility transistor or a diode coupled metal semiconductor field effect transistor.

19. A power amplifier comprising:
a first radio frequency power amplifier stage including a heterojunction bipolar transistor having an emitter, a base, and a collector; and
a first limiter circuit coupled to an input of the first power amplifier stage, the limiter circuit automatically adding attenuation at the input after an input power level threshold is exceeded, the first radio frequency power amplifier stage including at least one heterojunction bipolar transistor, the first limiter circuit including at least one field effect transistor, and the at least one heterojunction bipolar transistor and the at least one field effect transistor integrated on a single die.

20. The power amplifier of claim 19 wherein the single die is formed by an epitaxial growth process.

* * * * *